(12) United States Patent
Worth et al.

(10) Patent No.: US 8,739,148 B2
(45) Date of Patent: May 27, 2014

(54) AUTOMATED METER READING SYSTEM

(75) Inventors: Stephen Worth, Phoenix, AZ (US);
Gregory A. Forseth, Phoenix, AZ (US);
Mark Disalvo, Cave Creek, AZ (US)

(73) Assignee: Elster Electricity, LLC, Raleigh, NC (US)

( * ) Notice: Subject to any disclaimer, the term of this patent is extended or adjusted under 35 U.S.C. 154(b) by 1097 days.

(21) Appl. No.: 11/704,715

(22) Filed: Feb. 9, 2007

(65) Prior Publication Data

US 2008/0195562 A1    Aug. 14, 2008

(51) Int. Cl.
*G06F 9/44* (2006.01)

(52) U.S. Cl.
USPC .......................................... 717/168; 717/171

(58) Field of Classification Search
USPC .................................. 717/168–178
See application file for complete search history.

(56) References Cited

U.S. PATENT DOCUMENTS

| | | | |
|---|---|---|---|
| 4,291,375 A * | 9/1981 | Wolf ................................ | 702/62 |
| 4,298,839 A * | 11/1981 | Johnston ........................ | 324/157 |
| 4,383,772 A * | 5/1983 | Meier et al. ..................... | 400/55 |
| 4,621,330 A * | 11/1986 | Weikel ............................ | 702/62 |
| 5,239,575 A | 8/1993 | White et al. | |
| 5,369,691 A | 11/1994 | Cain et al. | |
| 5,381,462 A | 1/1995 | Larson et al. | |
| 5,495,167 A | 2/1996 | Cotroneo | |
| 5,548,527 A | 8/1996 | Hamminger et al. | |
| 5,627,759 A | 5/1997 | Bearden et al. | |
| 5,748,104 A | 5/1998 | Argyriudis et al. | |
| 5,923,269 A | 7/1999 | Shuey et al. | |
| 5,994,892 A | 11/1999 | Turino et al. | |
| 6,088,659 A | 7/2000 | Kelley et al. | |
| 6,137,423 A | 10/2000 | Glorioso et al. | |
| 6,396,839 B1 | 5/2002 | Ardalan et al. | |
| 6,512,463 B1 | 1/2003 | Campbell et al. | |
| 6,529,883 B1 | 3/2003 | Yee et al. | |
| 6,598,003 B1 | 7/2003 | Heino et al. | |
| 6,606,744 B1 * | 8/2003 | Mikurak ........................ | 717/174 |
| 6,832,373 B2 * | 12/2004 | O'Neill ......................... | 717/171 |
| 6,965,319 B1 | 11/2005 | Crichlow | |
| 7,006,934 B2 | 2/2006 | Jonker et al. | |

(Continued)

FOREIGN PATENT DOCUMENTS

| | | |
|---|---|---|
| CA | 2353929 A1 | 7/2000 |
| CA | 2602289 A1 | 9/2006 |

OTHER PUBLICATIONS

"Internet", Newton's Telecom Dictionary, Eighteenth Edition, Feb. 2002, pp. 385-386.

(Continued)

*Primary Examiner* — Anna Deng
(74) *Attorney, Agent, or Firm* — Baker & Hostetler LLP

(57) ABSTRACT

In an automatic remote metering system in accordance with the invention a method is provided for reprogramming each client utility meter from a host computer by downloading a reprogram first program from the host to a corresponding hub utility meter fourth memory portion via a communications link, verifying integrity of the reprogram first program, and downloading the reprogram first program from the hub utility meter to the client utility meter via a radio frequency link and overwriting the client utility meter first program code with the reprogram first program code.

31 Claims, 6 Drawing Sheets

(56) References Cited

U.S. PATENT DOCUMENTS

| | | | |
|---|---|---|---|
| 7,046,682 B2* | 5/2006 | Carpenter et al. | 370/401 |
| 7,549,149 B2* | 6/2009 | Childress et al. | 717/177 |
| 7,747,534 B2* | 6/2010 | Villicana et al. | 705/63 |
| 7,860,672 B2 | 12/2010 | Richeson et al. | |
| 2001/0051933 A1 | 12/2001 | Rowley et al. | |
| 2002/0109607 A1* | 8/2002 | Cumeralto et al. | 340/870.02 |
| 2002/0118119 A1 | 8/2002 | Hammond | |
| 2002/0158774 A1* | 10/2002 | Johnson et al. | 340/870.02 |
| 2003/0122686 A1* | 7/2003 | Ehrke et al. | 340/870.02 |
| 2004/0111699 A1* | 6/2004 | Rockwell | 717/103 |
| 2004/0128669 A1* | 7/2004 | Furst et al. | 717/178 |
| 2004/0192275 A1 | 9/2004 | Kim | |
| 2005/0030199 A1 | 2/2005 | Petite et al. | |
| 2007/0169075 A1* | 7/2007 | Lill et al. | 717/168 |
| 2008/0092132 A1* | 4/2008 | Stuber et al. | 717/173 |
| 2009/0228224 A1 | 9/2009 | Spanier et al. | |

OTHER PUBLICATIONS

"PPP", Newton's Telecom Dictionary, Eighteenth Edition, Feb. 2002, p. 584.

"World Wireless Communications Announces New Automatic Meter Reading Program; Six Utilities Pre-Registered to Evaluate Web-Enabled Technology," http://www.businesswire.com, Business Wire, Oct. 3, 2001, 3 pages.

ProQuest, "CellNet Data System to Provide First Internet Electric Company utility.com With Network Meter Reading Services Over Its California Network," PR Newswire. New York: Mar. 22, 1999, p. 1.

Rosenberg, "Dictionary of Computers, Information Processing and Telecommunications, Second Edition," Copyright 1984, 1987, pp. 144-145.

A3 ALPHA® Meter; Elster, Raleigh, North Carolina; 2006, two pages; Elster web site http://www.elsterelectrcity.com/en/a3_alpha.html.

Canadian Patent Application No. 2,710,623: Office Action dated Dec. 11, 2012, 4 pages.

\* cited by examiner

| Command Type | Definition |
|---|---|
| 00 | Current time* |
| 01 | New interval value / Effective Date |
| 02 | Time to call |
| 03 | New Firmware |
| 04 | New Host IP 1 address, & Port Number |
| 05 | New Host IP 2 address, & Port Number |
| 06 | Generate Random TTC |
| 07 | TOU Rates and Season Dates** |
| 08 | Effective Date |
| 09 | Holiday Dates*** |
| 0A | Effective Date |
| 0B | Reset Configuration |
| 0C | Opto Thresholds |
| 0D | Opto state machine Reset |
| 0E | Rate Config Flag |
| 0F | Billing Date |
| 10 | Event Notification Flag |
| 11 | Demand Config/ Demand Duration |
| 12 | DST (Effective month/date & enable / Disable flag) |
| 13 | GPRS APN |
| 14 | Demand Reset |
| 15 | Remote Disconnect |
| 16 | Cluster Channel |
| 17 | Cluster ID |
| 18 | Cluster Redistribution |
| 19 | Public Message Retry Interval |
| 1A | Private Message Retry Interval |
| 1B | Roll Call Time |
| 1C | Schedule Label |

FIG. 6

AUTOMATED METER READING SYSTEM

FIELD OF THE INVENTION

This invention pertains to utility company meters and systems for metering electrical energy, in general, and to single phase residential type watt-hour meters and systems and methods for the measurement of electrical energy consumption for revenue metering and for other energy consumption applications, in particular.

BACKGROUND OF THE INVENTION

Typically, electrical power supplied for residential applications is single phase alternating current power. To measure the consumption of electricity in residential applications, a utility company meter is provided at the electrical service entrance to the residence. Utility company meters are of three general types, namely, electromechanical based meters, purely electronic component based meters, and hybrid electromechanical/electronic meters. The electromechanical and hybrid type meters are essentially an induction motor in which the moving element is a rotating disk. The speed of rotation of the disk is directly proportional to the voltage applied and the amount of current flowing through the motor. The phase displacement of the current, as well as the magnitude of the current, is automatically taken into account by the meter, i.e., the power factor influences the speed of rotation of the disk. The result is that the disk rotates with a speed proportional to true power. In the electromechanical type of meters, a register is used to register the number of revolutions, and the gearing is arranged to be read directly in kilowatt-hours.

The electric utility meters most commonly in use are of the electromechanical type. The meters are generally highly reliable, but do not lend themselves to remote or automated reading.

Hybrid meters typically utilize electronic circuitry in combination with the rotating disk to permit at least limited two-way communication to/from the meter. Typically, the two-way communication is limited to reading the meter via a proprietary communications link that frequently is a limited range radio frequency link.

It is not uncommon for electric utilities to utilize both simple and complex tariffs. The tariffs may be time of use type tariffs, or may be changed from time to time or on predetermined dates to provide for various time of use type of rates.

It is common practice for utility companies to access meter information on only a monthly or 30 day period.

In addition, present metering technology makes it inconvenient for a consumer to determine in a timely fashion the amount of energy being consumed.

One problem with electronic programmable automatic metering systems is the difficulty of reprogramming meters that are in the system.

SUMMARY OF THE INVENTION

The present invention provides the next generation of time-sensitive advanced metering data collection and management solutions for utilities and energy service providers. The meter and system of the invention provide unmatched two-way, secure internet-based access to real-time usage information between data networks and control systems.

The system measures residential energy consumption and automatically communicates this information to a host computer. The host computer can then be accessed by the end utility customer or other authorized entities. This Internet or web based system offers two-way communication capability to support meter reconfiguration. The system is comprised of two major elements, a hardware unit and database software.

In accordance with the principles of the invention, a method of re-programming a utility meter that comprises a microcontroller is provided. The method includes: providing said utility meter with a first memory containing first program code, providing a second memory providing microcontroller control and providing a third memory for storing metering data. To perform reprogramming an application programmer is downloaded to the second memory. While utilizing the application programmer to control the utility meter, second program code is downloaded to the utility meter, the second program code overwrites said the program code. Control of said microcontroller is transferred to the second program code.

In accordance with an aspect of the invention integrity of the application programmer is verified prior to utilizing the application programmer to control the utility meter. In the event that integrity of the application programmer is not verified, use of the application programmer is aborted.

In the illustrative embodiment of the invention the integrity verification step comprises utilizing checksums to determine integrity.

In accordance with another aspect of the invention, integrity of the second program code is verified prior to overwriting said first program code. Overwriting of the first program code is aborted in the event that integrity of said second program is not verified.

An automatic meter reading system comprising a host computer and a plurality of groups of meters with each meter comprising a microcontroller operable to execute a firmware program includes a method of reprogramming the firmware program of each of the meters. The method comprises arranging each group of meters to have one corresponding hub meter and the remaining meters of the group as client meters. Communications between each client meter and the host computer is via its corresponding hub meter. The method includes providing in each client meter a first memory containing first program code, a second memory providing microcontroller control, and a third memory for storing metering data. An application programmer is downloaded to the second memory via the hub meter. The application programmer is utilized to control the client meter and is operable to continue communications at the client meter and being operable to perform metering operations while downloading program code. Second program code is downloaded from the hub meter to the client meter while the application programmer is controlling the client meter. The first program code is overwritten with the second program code and control of the microcontroller is transferred to the second program code.

Further in accordance with the invention, each hub meter is provided with a first memory containing first program code, a second memory providing microcontroller control, a third memory for storing metering data, and a fourth memory. An application programmer is downloaded to the hub meter second memory from the host computer. The application programmer is utilized to control the hub meter; and second program code is downloaded from the host computer to the hub meter fourth memory while the application programmer is controlling the client meter.

In an automatic remote metering system a method is provided including:

providing a plurality of groups of utility meters, each group comprising a plurality of client meters and a corresponding one hub meter, providing each client utility meter in a group with a microcontroller for controlling metering operations and communications, a first memory containing first program code, a second memory providing microcontroller control, and a third memory for storing metering data, and a radio frequency link to said corresponding hub utility meter;

providing the corresponding hub utility meter in a group with a microcontroller for controlling metering operations and communications, a first memory containing second program code, a second memory providing microcontroller control, a third memory for storing metering data, a fourth memory, a radio frequency link to the client utility meters in the group, and a communications link to a host computer; and reprogramming each client utility meter by downloading a reprogram first program from the host to the corresponding hub utility meter fourth memory via the communications link, verifying integrity of the reprogram first program, and downloading the reprogram first program from the hub utility meter to the client utility meter first program via the radio frequency communications link and overwriting the client utility meter first program code with the reprogram first program code.

In accordance with an aspect of the invention, the reprogramming step is executed while performing communication and metering functions in each client utility meter.

In accordance with another aspect of the invention, a frequency hopping spread spectrum communications link is provided as the radio frequency link.

In accordance with another aspect of the invention, the communications link comprises a cellular communications link.

In accordance with another aspect of the invention, the communications link comprises the Internet.

Further in accordance with an aspect of the invention, each hub utility meter is reprogrammed by downloading a hub reprogram first program from the host to each hub utility meter fourth memory via the communications link, verifying the integrity of the hub reprogram first program, and overwriting the hub utility meter first program code with the hub reprogram first program code.

The hub utility meter reprogramming step is executed while performing communication and metering functions in the hub utility meter.

In an automatic remote metering system in accordance with the invention, a method comprises:
providing a host computer;

providing a plurality of groups of utility meters, each group comprising a plurality of client meters disposed within geographic proximity to a corresponding one hub meter;

providing each client utility meter in a group with a microcontroller for controlling metering operations and communications, a first memory portion containing first program code, a second memory portion providing microcontroller control, and a third memory portion for storing metering data, and a short range radio frequency communications link to the corresponding hub utility meter;

providing the corresponding hub utility meter in a group with a microcontroller for controlling metering operations and communications, a first memory portion containing second program code, a second memory portion providing microcontroller control, a third memory portion for storing metering data, a fourth memory portion, a radio frequency link to said client utility meters in the group, and a communications link to a host computer;

operating each client utility meter and the corresponding hub meter such that metering information from each client utility meter is uploaded to the host computer by utilizing the corresponding hub meter to relay the metering information to the host computer; and reprogramming each client utility meter from the host computer by downloading a reprogram first program from the host to the corresponding hub utility meter fourth memory portion via the communications link, verifying integrity of the reprogram first program, and downloading the reprogram first program from the hub utility meter to the client utility meter first memory portion via the radio frequency link and overwriting the client utility meter first program code with the reprogram first program code.

BRIEF DESCRIPTION OF THE DRAWING

The invention will be better understood from a reading of the following detailed description in conjunction with the drawing figures in which like reference numerals are used to designate like elements, and in which:

FIG. 6 is a listing of command codes utilized in the illustrative embodiment of the system of the invention.

DETAILED DESCRIPTION

Figure 1:
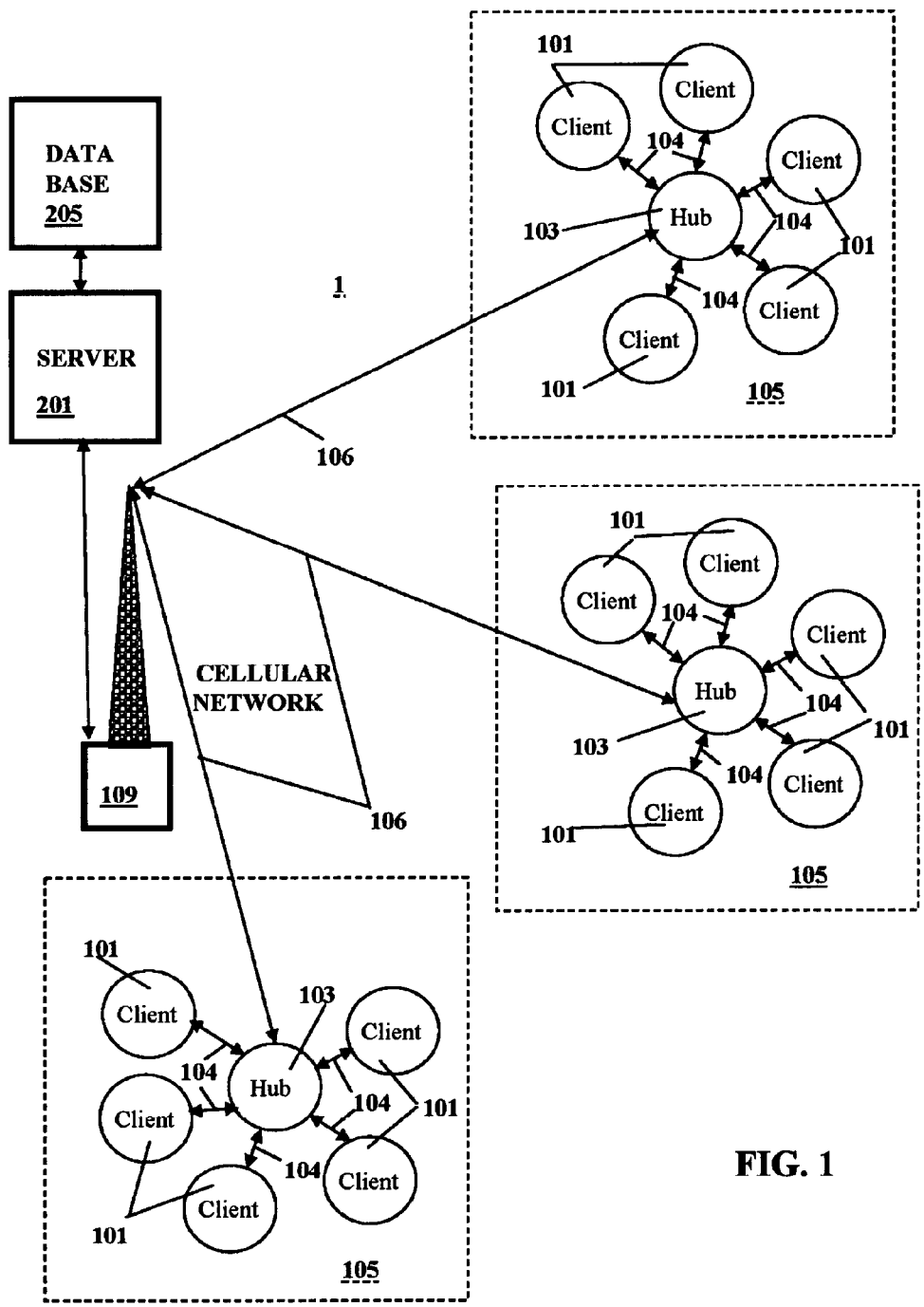
FIG. 1 is a diagram of an automatic meter reading system in accordance with the principles of the invention.

The advanced automatic meter reading system of the invention integrates data collection for metering purposes with a data transmission system. The advanced automatic metering system 1 shown in FIG. 1 is a two-way electricity meter reading system employing radio frequency communications.

In system 1 communications are organized as a star topology where utility meters are operational as either client meters 101 or hub meters 103. A plurality of or group of client meters 101 is associated with a corresponding hub meter 103. Hub meters 103 each comprise a cellular modem (GSM/GPRS) and a 900 MHZ ISM band radio. Client meters 101 each have only a 900 MHz ISM band radio. A local area network or LAN 105 is formed by each group of client meters 101 in communication with its corresponding hub meter 103 over an ISM band (915 MHz) short range radio link 104. Each hub meter 103 has, in addition to the ISM band radio transceiver 317, a GSM/GPRS modem 315 that allows for two-way TCP/UDP communications through the Internet to remote database servers. A group of client meters 101 are each associated with a corresponding hub meter 103 via radio frequency links 104 to form a cluster 105. System 1 includes a plurality of clusters 105.

System 1 further comprises a database server 201 remote from the clusters 105. The database server 201 of the illustrative embodiment comprises a Microsoft SQL Server that is coupled to the Internet, or in some applications to the utility company and to the cellular phone provider, via secure connections.

Figure 2:
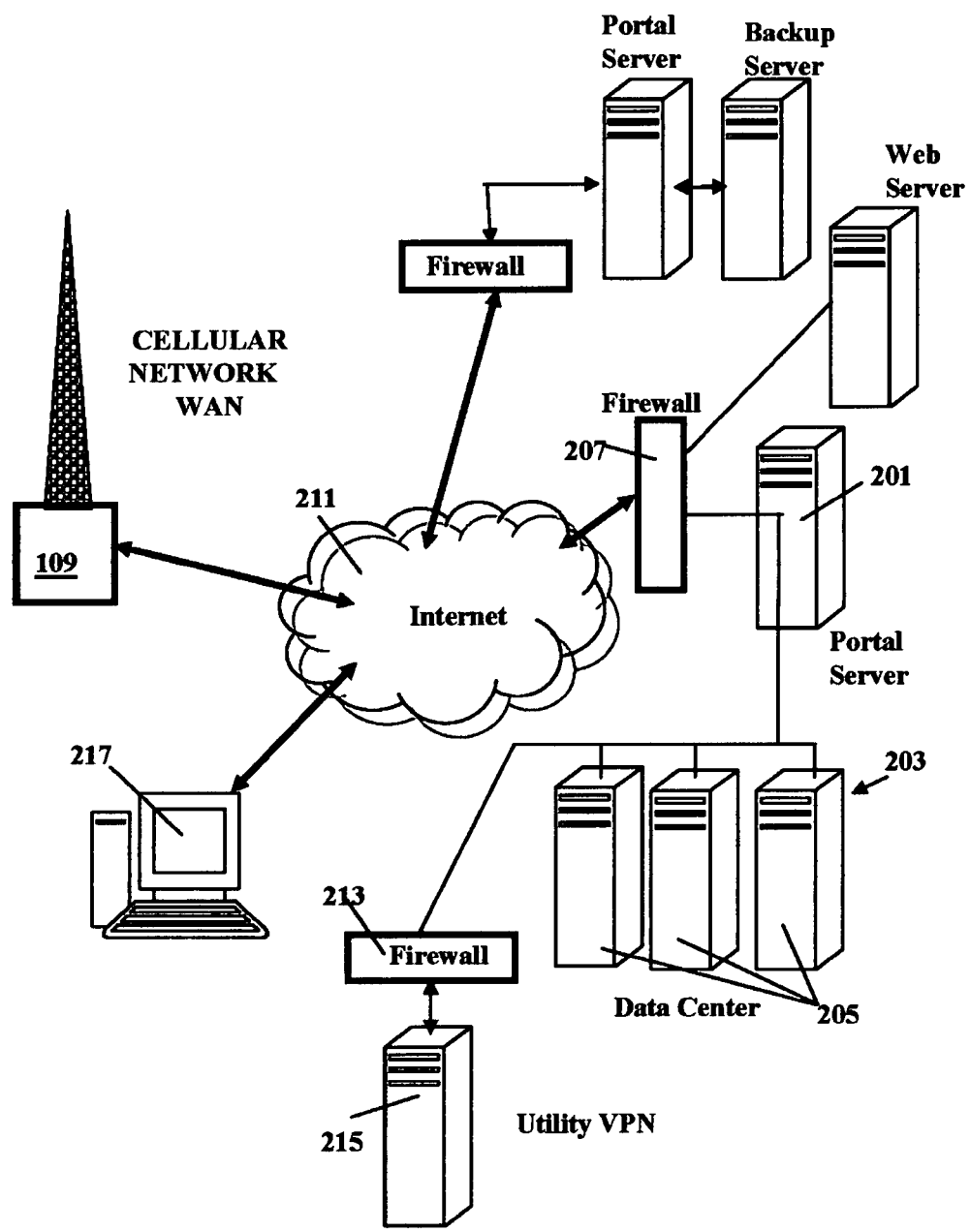
FIG. 2 is a diagram illustrating the host computer network access portion of the automatic meter reading system of the invention.

Turning now to FIG. 2, server 201 is coupled to a data center 203 that includes relational databases 205 in which utility meter acquired data and account information is stored. Server 201 and data center 203 are coupled via a firewall 207 to a computer network that in the embodiment shown is the Internet 211 that has access to utility meters 113. System 1 also is accessible via protective firewalls 213 by the utility company's virtual private network 215. In addition, Internet communication devices such as a personal computer 217 may access system 1.

System 1 uses short range 900 MHz ISM band radio transceivers to communicate between client meters 101 and hub meters 103. When it is time to send data to the database 205, a hub meter 103 establishes a TCP/UDP session with database portal 201 and uploads its data. The hub meter 103 then polls each of its corresponding client meters 101 and they send their data through to the database server 201. Once the daily packets have been sent, database server 201 sends back any new information that is available, such as new rate schedules, the current time or IP addresses.

Each night and on the occurrence of specific predetermined events, each hub meter 103, utilizing its corresponding cellular modem establishes a cellular phone link 106 into database server 201 to report consumption readings and other events. Database server 201 has the ability to send new information and commands back to the meters 101, 103. Typical commands would be to synchronize the time or perhaps reset the demand of a meter 101, 103. The configuration of each meter 101, 103 is controlled by database server 201 and new information can be sent to any meter 101, 103 to, for example, change rate plans or to switch an available whole house disconnect relay.

Each meter 101, 103 is fully self contained and is capable of recording KWH consumption as well as KW load. Each meter 101, 103 have a real time clock which has a power supply that is maintained during power outages using supercapacitors. No batteries are required to operate system 1.

Each meter 101, 103 is capable of recording KWH in a flat rate plan or can be configured to operate as Time-Of-Use meters. The configuration of each meter 101, 103 are kept within the meter in a non-volatile memory which in the illustrative meters comprises Electrically Erasable Read Only Memory EEPROM. New rate plans can be downloaded to each meter 101, 103 from database server 107.

Each meter 101, 103 are capable of storing interval data. In the illustrative embodiment, the intervals are as short as 15 minute intervals. The stored interval data is maintained in a meter 101, 103 for the last 31 days. In addition, each day at a predetermined time, which in the illustrative embodiment is chosen to be midnight, each meter 101, 103 takes a snapshot of the active register values (Total KWh, On Peak KWh, On Peak KW) and stores this information, along with a time/date stamp in non-volatile memory.

When a cluster 105 is installed, the cluster's hub meter 103 is deployed first and then the client meters 101 are typically installed afterwards. A cluster 105 typically has a ratio of one hub meter 103 to 25 client meters 101. When a hub meter 103 is placed in the field, at the time it is powered up it sends a message to the database server 201 indicating its condition and it also synchronizes its real time clock with the server 201. Subsequently, when each client meter 101 is installed it searches for a hub meter 103 over the 900 MHz rf link. Once a hub meter 103 is located the client meter 101 "joins" that cluster 105. When a client meter 101 joins a cluster 105, the client meter 101 synchronizes its real time clock with the real time clock of its corresponding hub meter 103. Once a client meter 101 has joined a cluster 105 the client meter 101 sends a "power-up" message to its corresponding hub meter 103 over the 900 MHz rf link, which it in turn passes on to the database server 201 via its cellular interface and the cellular network 109. If database 107 server has any new information for the client meter 101, that new information is sent back via the cellular network 109 to the corresponding hub meter 103 which in turn relays the new information to the client meter 101 over the 900 MHz rf link.

Each meter 101, 103 has its own unique serial number individually identifying it to the database sever 107. It is this serial number that is used as the primary key to a database 111 associated with database server 107. During manufacture, when the AMRS circuit board assembly is installed into a meter 101, 103, a meter serial number and a silicon serial number are recorded and entered into the server database 205. When a meter 101, 103 is set in the field at a customer premise the meter number is recorded against the premise number or physical address. This information is then added to database 205 making the specific relationship between silicon serial number, meter serial number and premise number or address.

System 1 is designed such that minimal configuration is required before the meters 101, 103 are set in the field. A default rate plan is pre-programmed into each meter 101, 103 that can be changed at time of order. If the rate plan needs to be changed then this can be done by instructing database server 201 that a particular premise/meter 101, 103 requires new information. Database 205 stores this information in a file on database server 201 by silicon serial number. The next time that a communication is received from that meter 101, 103, database 205 will determine that new data is available for that specific meter 101, 103 and send it over the communications link 109. The new rate plan information is sent with an effective date. Just past midnight on that day the rate plan will become active, meter 101, 103 will change its accumulation processes to follow the new rate plan.

Figure 3:
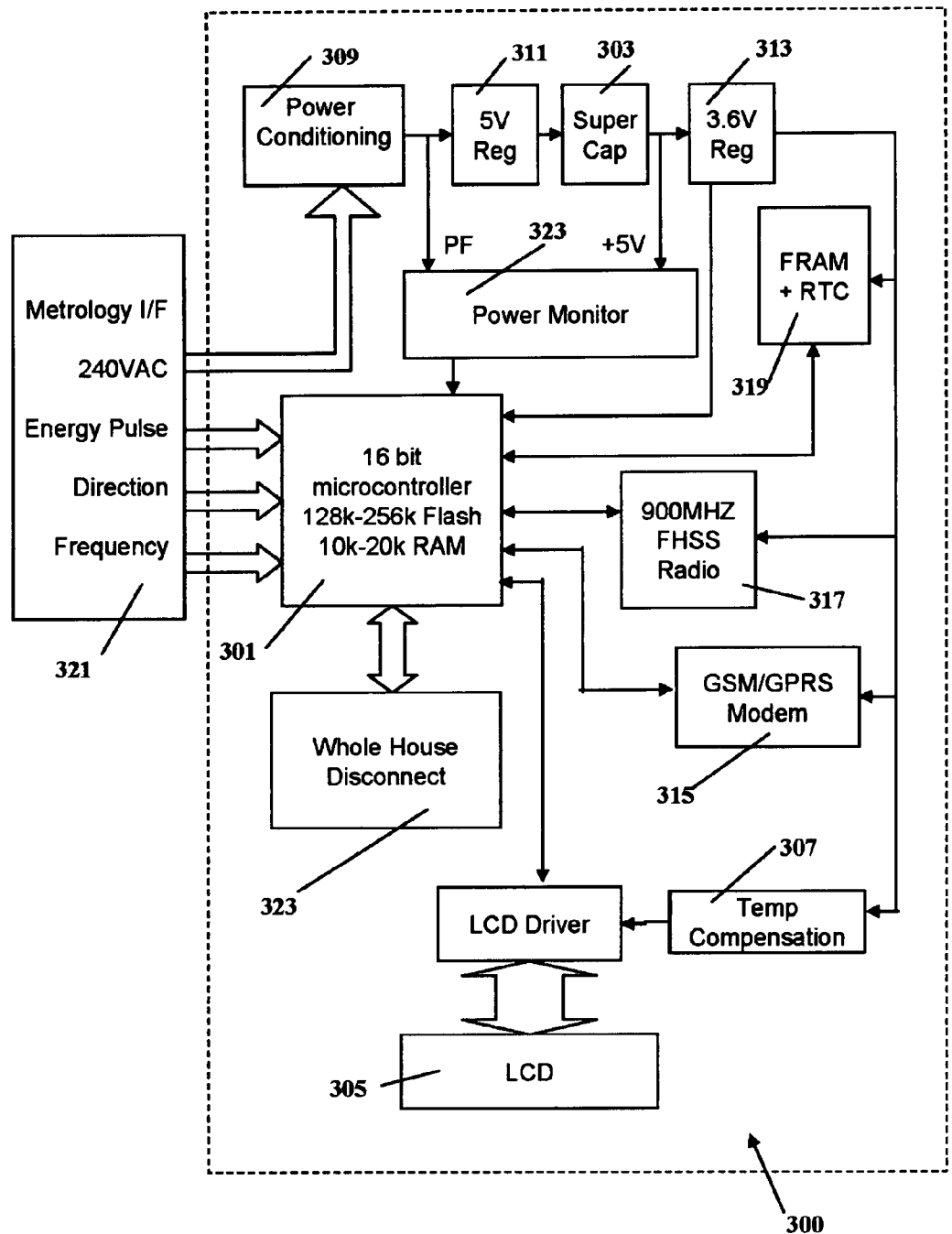
FIG. 3 is a block diagram of a utility meter in accordance with the principles of the invention.

Numerous data items for each meter 101, 103 can be reprogrammed from the database. FIG. 3 is a table of the programmable data items.

Figure 4:
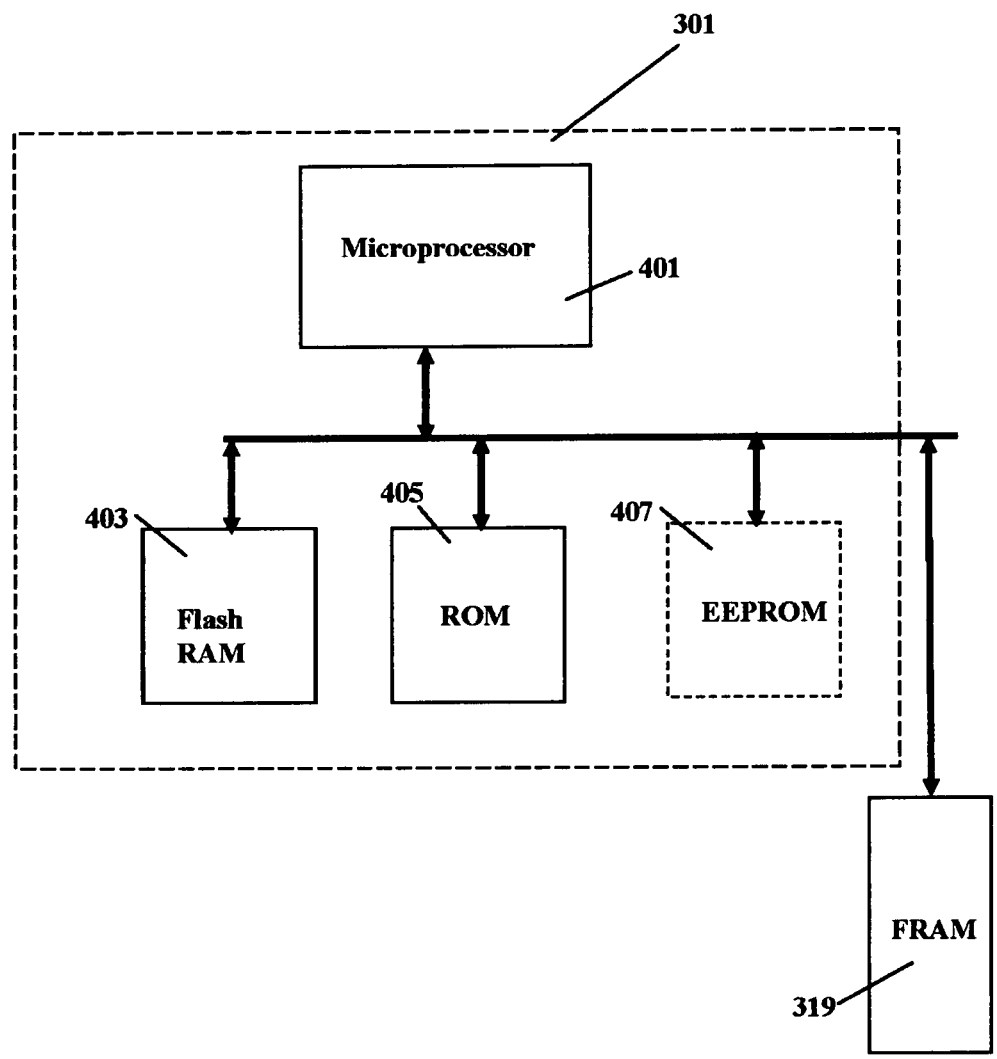
FIG. 4 is a more detailed block diagram of a microcontroller utilized in the utility meter of FIG. 3.

Meters 101, 103 in the illustrative embodiment use a commercially available meter base. More specifically, in the illustrative embodiment, the Schlumberger CENTRON Solid State meter base is utilized. The Centron meter base is a Hall effect meter that produces a 10ms pulse for each 1 watt hour of electricity consumption. The Schlumberger display printed circuit board assembly is replaced by a board assembly or meter module 300 shown in FIG. 4. It will be appreciated by those skilled in the art that other meter bases may be utilized.

Meter module 300 for each meter 101, 103 is housed under the cover of the CENTRON meter. Meter module 300 includes a Liquid Crystal Display (LCD) 305, power supply converting 240VAC to 5 and 3.6VDC, a microcontroller with FLASH memory, non-volatile memory for data storage (EEPROM), a real time clock and a 900 MHZ band radio transceiver 317.

Each meter module 300 records pulses that are produced by the meter metrology unit. In the illustrative embodiment, each pulse representing 1 Watt Hour of energy consumption. Each meter module also displays the accumulated total energy consumption on the LCD. The energy pulses are also accumulated into programmable interval buckets (15 m to 1 hour) and these in turn are collected into 1 day packets. Each night between the hours of midnight and 5 am the daily packets are uploaded to a data base server 107.

Each meter module 300 can be remotely programmed as a flat rate energy meter (all pulses accumulate to the TOTAL register) or as a time of use energy meter where pulses accumulate to the TOTAL accumulator in addition to one of 4 other accumulators (ON PEAK, OFF PEAK, SHOULDER 1 or SHOULDER 2) depending of the time of day, day of the week or holiday.

In system 1 the same system board 300 is utilized for hub meters 103 and client meters 101. Each hub meter module 300 includes a GSM/GPRS modem 315 with an associated subscriber identity module and an antenna which are not shown. Meter module 300 includes microcontroller 301 which is a commercially available device comprising a 16-bit microcontroller running at 15 MHz with up to 256 kB of FLASH memory and up to 20 kB of RAM. In addition there is 16 kB of EEPROM that is used for system configuration information, consumption registers and up to 31 days of interval data. Microcontroller 301 includes a real time clock running from a 32 kHz crystal synchronized to the database server 201. The clock is backed up during power outages through the use of super-capacitors 303. Supercapacitors 303 are commercially available units that provide a large capacitance in a physically small package. Supercapacitors 303 will maintain time operations for up to 4 days during the absence of mains power.

A liquid crystal display 305 provides customer consumption and time/date information on 0.6" high characters as well as diagnostics information during communications operations of by small status digits. The contrast of the display 305 is maintained through changes in ambient temperature by the use of a thermistor based temperature compensation circuit 307 on the voltage bias of the LCD.

Incoming 240VAC power is conditioned by the on the board power supply power conditioning circuit 309, smoothed and regulated to 5 volts D.C. by regulator circuit 311. The 5 volt rail charges 2 super-capacitors 303 that provide power in the event of loss of line voltage. Adequate energy is stored for up to 45 seconds of operation allowing a power fail message to be sent to database server 111. In addition the 5V is further regulated to 3.6V by regulator circuit 313 to power microcontroller 301 and other circuitry.

Three serial communication interfaces are provided: a cellular modem (WAN) 315, a 900 MHz radio frequency transceiver (LAN) 317 and a diagnostics/factory programming port. Microcontroller 301 is capable of duplex communications, in real time on the two main communications ports, i.e., cellular modem 315 and transceiver 317.

Client meters 101 only have the 900 Mhz radio transceiver 317 installed and are firmware programmed as clients. Hub meters 103 have both the 900 Mhz radio transceiver 317 and a GSM/GPRS cellular modem 315 and are firmware programmed as hub meters.

In the illustrative embodiment of system 1, commercially available metrology is utilize into which module 300 simply snaps into the meter base clips (replacing any previously installed register) and interfaces to the electricity meter metrology board 321 via a connector. As noted above, the illustrative system utilizes a meter and a metrology board that are commercially available as the Centron metrology from Schlumberger. The metrology board 321 has an edge connector to which board 300 connects. No other connections are required.

Metrology board 321 has interface signals indicated symbolically by the bus leads shown in FIG. 3: There are 240VAC connections. A direction or sign signal indicates if the meter has been installed upside down, that is energy is not flowing in the expected direction. Energy signal pulses are provided once for each 1 WH of electricity consumption. These pulses are accumulated by the microcontroller to produce register values and interval data.

Monitoring circuits 323 are provided on board 300 so that microcontroller 301 can determine if there has been a loss of line voltage. Monitoring circuits 323 also monitor the 5V rail so that the meter does not attempt to operate with incorrect system voltages.

Microcontroller 301 incorporates a hardware watchdog circuit that once activated must be retriggered (by software) every 100 ms or sooner or it will cause the system to go through a full system reset. The feature has the effect of continually monitoring operation of the embedded firmware. Should the program get "stuck" at any point then the watchdog circuit will time out, forcing the microcontroller 301 to restart. The software is set up such that every 15 minutes all critical data is stored to EEPROM and it is from here that module 300 operations will be restored after the reset condition.

The GSM/GPRS modem 315 in a hub meter 103 is capable of establishing a TCP/IP connection to a remote computer. Once this connection is established data can pass freely between the hub meter 103 and the remote computer.

No special actions are required to install a hub meter 103. One hub meter 103 is logically capable of supporting up to 250 client meters 101. However the 900 MHZ radio transceivers 317 each have an effective range of 600-800 ft in residential neighborhoods. In residential neighborhoods, the number of client meters 101 per hub meter 103 may on the average be 25. In areas of higher density, such as apartment complexes, higher numbers of client meters 101 can be operated with each hub meter due to the closer proximity of the meters to each other. In some cases a hub meter 103 may have few or no client metes associated with it if the premise density is very low.

Database 205 has the relationship between each meter serial number and silicon serial number pre-stored. After a meter 101, 103 is installed the relationship is built between the meter serial number and the installation premise number in order to accurately bill electrical consumption by customer.

A whole house disconnects relay 323 is housed in a collar that sits between the meter and the electricity supply cabinet. Whole house disconnect relay 323 allows power to the premises to be turned on and off remotely using signals sent from the database server 201 to a hub meter 103 over the GSM/GPRS network 109 and then over the 900 MHz radio frequency links to a client meter 101 if required.

By controlling the whole house relay 323 power to the premises may be turned on or turned off at a scheduled time in the future or immediately. When a signal to turn the power on is sent to a client meter 101 or hub meter 103, the recipient meter 101, 103 does not immediately restore power to the premises. For safety reasons it is necessary for a button located on the meter collar to be depressed in order to tell the system that it is safe to restore power to the premises.

Each client meter 101 and hub meter 103 is configurable to provide rate scheduling according to rate schedule information selectively addressed to the meters. A rate schedule message in the illustrative embodiment includes a plurality of fields of schedule information. A first field of N-bytes provides for four possible day schedules per season (Weekday, Saturday, Sunday and Holiday). Each day schedule has a data field of one byte for four rate schedules. This Byte has information regarding which day schedule it is and for which season. Four time frames are possible for each Rate Schedule. The four rate schedules in the illustrative embodiment are ON, OFF, shoulder one (SH10) and shoulder two (SH2). Each time frame comprises a start time and a rate code. The first time starts with 00:00, and is followed by the rate code. The code for each rate schedule is: 01—ON time; 02—OFF time;

03—SH1 time; and 04—SH2 time. The start time of the next rate schedule is the end time of the previous one.

Rate schedule information can be preprogrammed for a plurality of seasons, which in the illustrative embodiment is a maximum of eight seasons. Season information contains season starting dates. The start of one season specifies the end of previous one. The date of start of each particular season is provided. Each season begins at 00:00 Hrs of the specified date.

Rate schedule information can also be programmed for a plurality of holidays. In the illustrative embodiment, up to twenty two holidays are possible. The day, month, and year of each holiday is provided. Season and holiday rate schedule information for two years is downloaded in a single communication.

Each hub meter is identified as a hub meter by a front panel label designating the meter as a hub meter 103. Each hub meter is shipped with a default time of use (TOU) program (9 am to 9 pm M-F=On Peak) with 1 hr block demand for On Peak periods. Each hub meter selects its radio transceiver 900 MHz Channel set and cluster ID. Similarly, no configuration is required for the GSM/GPRS WAN interface.

At installation of a hub meter, the existing meter is removed from socket its. Module 300 is installed. Meter module 300 will power up going through a predetermined display sequence. The predetermined display sequence for the hub meter is as follows:

All display segments on.
Display of Silicon ID—first 6 characters
Display of Silicon ID—final 6 characters Meter module 300 then starts its normal message scroll on the main display:

Time of day—11:15:43
Date—Jul. 26, 2004
Rate Plan Indicator—ETC-1R
Total KWH—000023 KWH
Peak KWH—000006 KWH
Peak KW—02.7 KW Once a hub meter 103 has executed its power on reset process it initiates a power up communication with a host computer or database server 107. A public link data connection from the hub meter 103 to the host computer is established using GSM/GPRS modem 315. For hub meter 103 to open up a communication socket on the host computer AMRUDP program it must authenticate itself to the host. This security measure ensures that only valid connections can be established with the host computer. Once authenticated hub meter 103 sends its power up message that contain the silicon ID of the hub along with the time and date of the event. Once this message has been accepted by the host computer then the current time is returned to hub meter 103. If there are no pending power up messages from client meters 101 in the cluster 105 managed by hub meter 103 then the public link connection is closed. If there are pending power up messages from client meters 101, the power up messages are passed to the host computer. If there is any new information pending for download for any client meter 101 of the cluster 105 then the download is executed and, after it is acknowledged, the public link connection is closed.

In the lower left corner of the LCD 305 there is a 3 digit display. The 3 digit display has 2 display modes—a normal mode and a status mode. In the normal mode the left 2 digits indicate the meter register number currently displayed. The third digit will display a "walking segment" that moves each time a consumption pulse is received from the metrology board 321.

In the status mode a status indicator is lit and then the 3 digit display indicates the progress state of the communications link.

Once a successful public link communications scenario has been completed the display shows a predetermined character configuration. In the illustrative embodiment the predetermined character configuration 6P≡ if the connection was successful or 6F≡ if a failure occurred. During a successful communications with the host computer a hub meter 103 receives updated time from the host computer.

Each client meter 101 differs from each hub meter 103 in that client meters do not have any special front panel markings. Each client meter 103 is shipped with a default TOU program that sets 9 am to 9 pm, Monday through Friday as on peak with 1 hr block demand for on-peak periods. No other communications settings are required. When a client meter 101 powers up it will cycle through the same displays as the hub meter 103. After power-up, client meter 101 enters into a hub search mode. Client meter 103 broadcasts a "seeking hub" message over its 900 MHz rf link. If a hub meter 103 hears this message, the hub meter 103 responds and client meter 101 will join the cluster 105 managed by hub meter 103. During this exchange hub meter 103 will send the current time to client meter 101.

Once client meter 101 finds a hub meter 103 it sends a "power-up" message to hub meter 103. When a hub meter 103 receives a power-up message, hub meter 103 establishes a public connection link through its GSM/GPRS modem 315 to the host computer. Once the link is established the power-up message is passed through to the host computer. Successful receipt a power-up message is acknowledged by the host computer to hub meter 103 which will then pass the acknowledgement on to client meter 101.

After passing the acknowledgment on, hub meter 103 waits for any other power up messages to be received for a period of 30 seconds and passes on any additional ones that are received. After the 30 second window closes the host computer downloads the current time to hub meter 103 which acknowledges receipt of the message. Hub client 103 asks the host computer application if it has any new information, e.g., meter configuration, demand reset, for any client meters 101 of the cluster 105. If there is any new information, it is downloaded and passed on to the appropriate client meter.

Once this process is complete the connection with the host computer is terminated and the LCD status display will show 9P≡ if the transactions were successful.

After initial field power up and cluster 105 configuration, client meters 101 expect to be able to find the same hub 105 that they previously contacted. Client meters 101 will each attempt to immediately send its power-up message to its last known hub meter 103. Communications protocol at the low level will attempt to open up a socket with a hub meter 103 in the associated cluster 105. If a hub meter 103 is not busy it will acknowledge the communication with a message that includes an ACK and the current time. Hub meter 103 will then open up a connection to the host computer via the public link and relay the power-up message to the host computer. If hub meter 103 is busy communicating with another client meter 101 it will acknowledge the transaction with a "not-ready" message and will send back the current time. In this case client meter 101 will wait for 1 minute and then try again.

In the event of a power outage, a "power fail" scenario can be initiated by a hub meter 103 from its local power sense or it could be initiated from a client meter 101 that has detected its own power failure. At hub meter 103, the first step is to cancel any currently active communications scenario. If power failure is sensed at a client meter 101, a short delay is started. If the corresponding hub meter 103 is also failing, it will send out a broadcast to synchronize client meter 101 responses. Each client meter 101 is assigned a period to delay after receiving the request, and before transmitting its response. However, if a client meter 101 does not receive a broadcast from its hub meter 103 it sends a broadcast to get its hub meter 103 to initiate a power fail scenario. Client meter 101 will still respond to its hub meter 103 broadcast later.

After a hub meter 103 collects power fail statistics from the clients, the information is passed on to the host system on the public link.

The standard upload process is a communications process that should be performed daily. It is controlled by hub meters 103 to collect data in an orderly manner. When a hub meter 103 determines that it is its scheduled 'time to call,' hub meter 103 establishes a communication link via a public link connection with server 101. Once a communication link is established, hub meter 103 sends any pending packets to server 101. Normally there would be only one packet, for the prior day. However, if communications failed in recent days there may be up to a months worth of data packets. Each data packet contains a sequence to notify server 101 how many more packets to expect from this meter 101. There is also a flag, added by the corresponding hub meter 103, which indicates if this is the last known client meter 101 in its cluster 105. Once the packets from a hub meter 103 have been sent, hub meter 103 establishes a link connection with the first client meter 101 in its membership table. Hub meter 103 forwards data packets from its client meters 101 to the host computer.

When all client meter 101 packets have been sent to the corresponding hub meter 103, the link connection is closed and hub meter 103 starts processing the next client meter 101. After packets for all client meters 101 have been sent, the server 201 may have download packets (new info) that are destined for the hub and/or clients.

For each new info packet that is destined to a client, the private link is opened with that client. The packet is delivered, and the connection is closed.

When no more packets are available from server 201, a terminate packet is sent from server 201.

If an exceptional event occurs on a client meter 101, (Back Rotate, Hardware Error), server 201 is notified. When a client meter 101 needs to send a message to server 201, it opens a private connection with its corresponding hub meter 103. Corresponding hub meter 103 in turn opens a public link connection with server 201 and the packet is routed from client meter 101 through hub meter 103 to the server 201. If the packet is successfully received an acknowledge or ACK is sent back to client meter 101 through corresponding hub meter 103 and the connection is closed. If server 201 does not successfully acknowledge the packet hub meter 103 will try up to 5 more times to send the message to server 201. If it is still unsuccessful it will close the public link and send a status message NACK to the client meter 201.

These status messages are also considered as events and will be entered into the event log and sent to the server 201 as part of the daily standard upload.

The recorded events are:
Time Change
Old Time/Date, New Time/Date, Update Type (PU, STD Upload, Host Query)
Demand Reset
Time/Date, Demand Value prior to reset
Reverse Rotate
Time/Date
New Schedule Implemented
Records the Time and Date at which the new schedule went into effect and also saves active Register Values as of midnight on the day prior to activation.
Remote Disconnect
Time/Date action occurred, Action type: On, Off or customer confirmation for button press
Hardware Error
Time/Date, Type code for problem Initially when a client meter 101 or hub meter 103 is programmed, it has no identification information. During the factory test and configuration phase some basic configuration data is received by the meter 101, 103:

| | |
|---|---|
| Device ID | (unique) 6-byte value generated by the database |
| System ID | single-byte customer ID |
| Device Code 1 | 8-byte random value assigned for authentication |
| Device Code 2 | 8-byte random value assigned for authentication |
| Host Public Key | 1024-bit key pair for RSA encryption |

Additionally a hub meter 103 will receive the following configuration data:

| | |
|---|---|
| Primary IP | primary host IP address information |
| Primary Port | primary host UDP port information |
| Secondary IP | secondary host IP address information |
| Secondary Port | secondary host UDP port information |

A hub authentication phase is required before a hub meter 103 can communicate with a host server 201. The authentication phase only needs to be completed again if the authentication information expires, or the host server 201 and a hub meter 103 become out of sync. In that circumstance hub meter 103 sends a hub-authentication request packet to the host server 201. The hub-authentication request comprises:

| | |
|---|---|
| Header | Hub-Authentication request identifier |
| Device ID | Hub's device ID |
| Encrypted data | 128-byte block of encrypted data (using host public key) |
| Device Code 1 | Hub's device code (validated by the database) |
| Random | Random data that the response is masked with |

Once the host server 201 deciphers and validates the encrypted data, it responds as follows:

| | |
|---|---|
| Header | Hub-Authentication response identifier |
| Masked data | using the random mask in the request |
| Device Code 2 | Host's response for authentication |
| Secret | Host-Hub shared secret block |

Further communications will be masked with a derivative of the shared secret block.

A client meter 101 authentication phase is required before a client meter 101 can communicate with a hub meter 103 or host server 201. The authentication phase only needs to be completed again if the authentication information expires, or the system becomes out of sync. Client meter 103 sends a client-authentication request packet to its hub meter 103 as follows:

| | |
|---|---|
| Header | Client-Authentication request identifier |
| Device ID | Client's device ID |
| Encrypted data | 128-byte block of encrypted data (using host public key) |
| Device Code 1 | Client's device code (validated by the database) |
| Random | Random data that the response is masked with |

Hub meter 103 simply forwards the packet to host server 201 as is.

After host server 201 deciphers and validates the encrypted data, it responds as follows:

| | |
|---|---|
| Header | Client-Authentication response identifier |
| Masked data | using the random mask in the client request |
| Device Code 2 | Host's response for authentication |
| Random | client's copy of random data to handshake with hub |
| Random | hub's copy of random data to handshake with client |

Hub meter 103 extracts the random data host server 201 set up for hub meter 103 to client masking. Hub meter 103 adds the shared secret for the client meter 103 in the following message to client meter 101.

| | |
|---|---|
| Header | Client-Authentication response identifier |
| Masked data | using the random mask in the client request |
| Device Code 2 | Host's response for authentication |
| Random | client's copy of random data to handshake with hub |
| Masked Data | using the random mask in the host response |
| Secret | Hub-Client shared secret block |

This process indirectly authenticates a hub meter 103, and sets up a shared secret between a hub meter 103 and its client meters 101. The shared secret will be used to mask any further communications.

After authentication has been established, additional sessions can start in the reconnect phase. The downlink device starts by sending a reconnect request:

| | |
|---|---|
| Header | Reconnect request identifier |
| DeviceID | 6-byte device ID assigned at configuration |
| Session | 2-byte session number |
| KeyCheck | 2-byte crc of derived mask |

If the authentication information is valid, a connected packet is returned, signifying that any further packets should be masked.

The uplink device enforces that session numbers cannot be reused, and that the session numbers are always incremented. It is acceptable to skip session numbers. If the authentication fails, the uplink side sends a failure packet. On receipt of the failure packet, the downlink side should re-authenticate.

An algorithm is used to generate a session mask. Replay attacks are guarded against by invalidating the session number after use.

The packets are masked using the exclusive or operator on the data and the mask. Further as an additional precaution, a single random byte is prefixed to the encrypted block (masked as any other data byte). The random byte will be used to alter the block to minimize the risk of monitoring for known bit patterns.

Should an authentication session fail, due to a bad key, the downlink side can request a new key to be generated for a client meter 101. Host server 201 would first log this request, as it will be important to monitor this situation and audit as necessary. After logging the event, host server 201 will generate a new key, replace the database record in database 205, and transmit the public portion to client meter 101.

At this point, a hub meter 103 or client meter 101 will accept the key blindly. If the host server 201 was being spoofed, the actual host server 201 should notice that the hub meter 103 or client meter 101 no longer is reporting. Technically, this opens the possibility of a man-in-the-middle attack. With a well-implemented man-in-the-middle attack, an audit would need to verify that the host's public key matches the client's copy of the host public key.

A process is provided to determine if a new key is required starts by sending the last known public key. If the query is from client meter 101 to host server 201, the hub meter 103 is just a forwarder. The request is:

| | |
|---|---|
| Header | Key request identifier |
| Host Public Key | Last known public key |

Host server 201 will verify that it is incorrect, or possibly restore the key if it is still known. Host 201 will reply with either the old key, or a new one with the following message:

| | |
|---|---|
| Header | Key response identifier |
| Host Public Key | Current public key |

If a new key is generated, hub meter 103 will also request a new pair of device codes for authentication. The message from hub meter 103 will be:

| | |
|---|---|
| Header | Device-Code request identifier |
| Device ID | Hub's device ID |
| Encrypted Data | 128-byte block of encrypted data (using host public key) |
| Random | Random data that the response will be masked with |

Host server 201 will generate and deliver a new pair of device codes.

A new session is established after receiving the shared secret.

If a new key is generated, a client meter 101 will also request a new pair of device codes for authentication.

Hub meter 103 simply forwards the packet as is.

Host server 201 will generate and deliver a new pair of device codes.

Hub meter 103 extracts the random data host server 201 set up for hub meter 103 to client masking. Hub meter 103 then adds the shared secret for client meter 101.

A new session is established after receiving the shared secret.

Keys and device codes are changed in an orderly manner by delivering a key and device codes in a new-info message, under the security of the old key. After the new-info is delivered, the change should be recorded in the backend database 205.

A shuffle algorithm is used by host server 201 to alter mask seeds between sessions. The process involves host server 201 shuffling a block of bytes. The result is a predictably altered mask.

A generation number is incremented, so that each client meter gets a different secret.

A session mask is used to mask all application layer data, sent or received. There are two indexes maintained to track the position for the next mask byte—one for upload data, and the other for download data. All data that originates at host server 201 is considered download data. All data destined to a client meter 101 is considered download data as well. Data in the reverse direction is considered upload data. The upload index starts at 0 for every session, while the download index starts at the offset defined by the first byte in the session mask.

The input to the mask algorithm has a random salt value inserted at the beginning of the data block. Mask bytes are applied consecutively from an associated index value. An index value is incremented (cyclically around buffer) for every mask byte used.

After authentication, in one of the above-described manners, a connection is considered 'secure'. The authentication established a session mask that is between 64 and 128 bytes long. Both the uplink and downlink communication streams are encoded with this circular mask. Every packet also has a random salt value that helps to keep the mask secret.

Client meters 101 and hub meters 103 each include a microcontroller 301. Microcontroller 301 includes a flash random access memory RAM 403 and a read only memory, ROM 405. RAM 403 stores program code and compile time constants, run time constants—backup block, run time constants—security identity, run time constants—rate schedule, and ROM monitor code and processor vectors. ROM 405 stores in one block processor control (SFR). ROM 405 has a block of memory allocated by compiler and includes a ROM monitor memory block.

In addition, each hub meter 103 includes an additional EEPROM memory, EEPROM 407. EEPROM 407 is utilized for storage of code updates.

A separate FRAM 319 is coupled to each microcontroller 301. FRAM 319 stores interval and TOU data for later transmission.

Each microcontroller 301 is operated in accordance with programs stored in RAM 403. The programs are firmware that may be programmed and reprogrammed from database server 201. The firmware is received at a client meter 101 or hub meter 103 as an entire flash memory image that is verified for integrity before being executable as the active code for the respective device. Advantageously, the firmware in a meter may be re-programmed without loss of any metering data.

Figure 5:
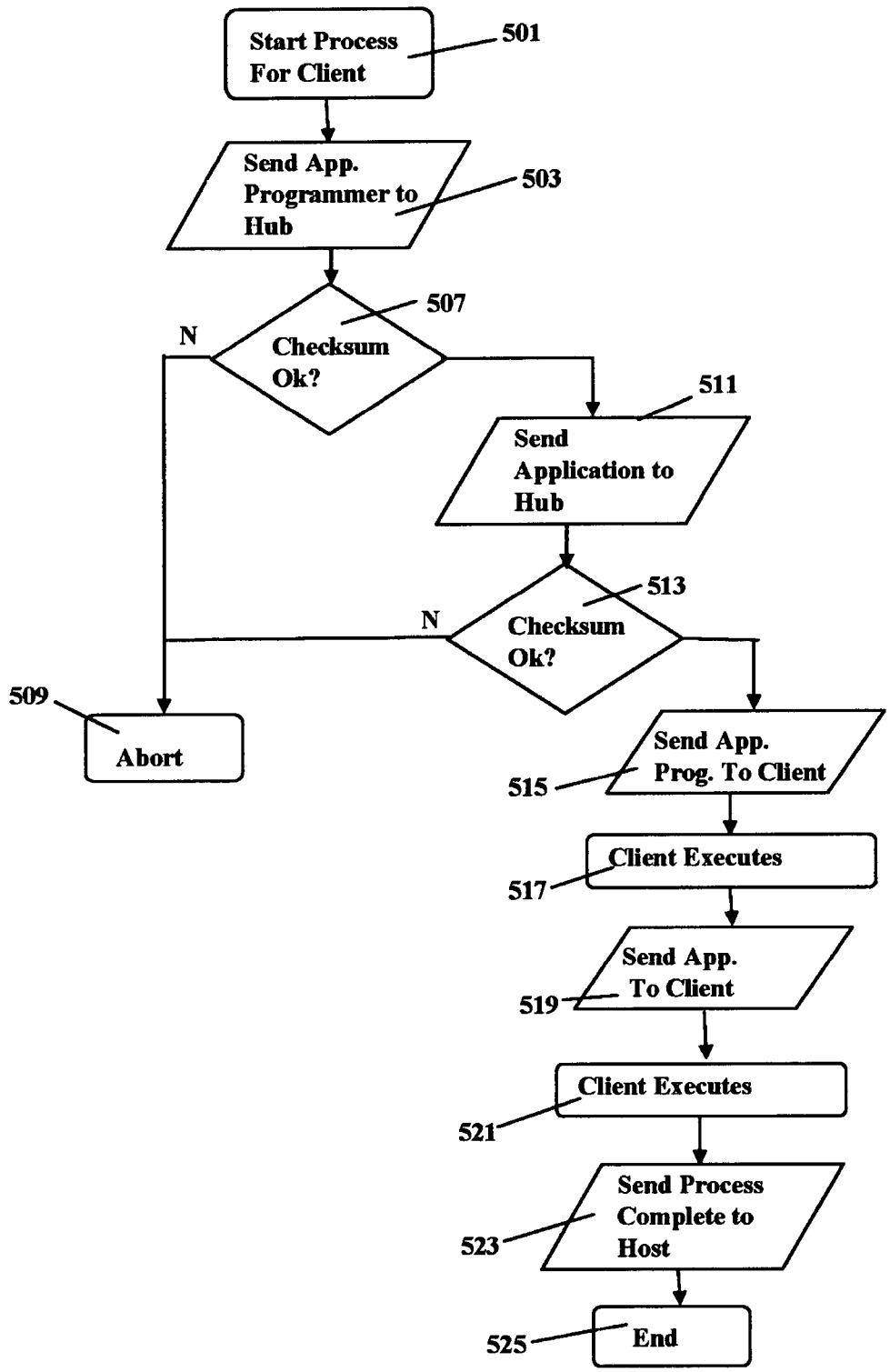
FIG. 5 is a flow chart illustrating a method of remotely reprogramming individual power meters in accordance with the principles of the invention.

When it is desirable to reprogram a hub meter 103, the process is started by database server 201 at step 501 as shown in FIG. 5. Database server 201 downloads an application server program to a hub meter 103 at step 503. Hub meter 103 verifies the application server program at step 507 using multiple checksums. If the checksums do not match the process is aborted at step 509. If the checksums match at step 505, control is transferred to the application server program. The application server program is capable of continuing communications as well as metering operations.

At step 511, the application server program receives the new main application from database server 201. The main application program is stored in EEPROM 407 and is verified for integrity using checksums at step 513. If the checksums do not match, the process is aborted. Once the new main application program is completely downloaded and stored in EEPROM 407, if it is intended for use by the hub meter 103, RAM 403 is overwritten, major vectors are overwritten and control is transferred to the new program application. In operation, the application is downloaded in small blocks to make the process more reliable. The process is restartable at any point. All download operations are controlled by the database server 201.

If a client meter 101 is to be reprogrammed, then after step 513, the application server program is downloaded to client meter 101 at step 515. The application server program is executed by client 101 at step 517. The application program is downloaded to client meter 101 at step 519 and, at step 521, the new application program is executed. A message is sent back to database server 201 indicating successful completion of the re-program download at step 523 and the download process is completed at step 525.

Database 205 comprises account identification information to identify a user account, a utility meter serial number for a utility meter for the user account, and utility meter configuration information for downloading to said utility meter. Database 205 further includes account consumption information obtained from said utility meter.

Database 205 is utilized for storage, configuration and analysis of energy usage data that is transmitted from client meters 101 and hub meters 103. Database 205 maintains the usage information in a summarized form and provides real time analysis of the data via open and secure API's (application protocol interfaces). Database 205 can be accessed over Internet 211 to access and extract data files.

System 1 provides timely access to time-sensitive usage data gives energy providers an edge in an increasingly competitive and rapidly transforming utility environment. Electric usage meters in accordance with the invention, capture and transmit energy-use information in configurable time intervals directly to a data center 203 via public networks.

By utilizing the Internet, cost-effective reliable intelligent meters, existing public network infrastructure, and sophisticated head-end database management systems, a system in accordance with the principles of the invention offers unparalleled practical, flexible, metering modernization solutions to electric utilities customers. The system of the present invention eliminates the need to deploy costly, complex, and often high-maintenance private communications networks to capture periodic utility data. Standard Internet browser technology and encrypted messaging provide secure, easy accessibility to metered data.

System 1 utilizes a scalable architecture that permits power usage data to be calculated and stored incrementally for automatic transmission. System 1 gives great latitude to utilities to select a deployment strategy best suited to their unique needs. There is no implicit requirement for mass installation of geographic metering territories as with some systems. Thus, utilities with strategies for "surgical" implementation of AMR are easily accommodated.

The invention has been described in terms of embodiments of the invention. It will be apparent to those skilled in the art that various changes and modifications may be made to the embodiments shown and described without departing from either the spirit or scope of the invention. It is intended that the invention include all such changes and modifications. It is further intended that the invention not be limited to the illustrative embodiments shown and/or described. It is intended that the invention be limited only by the scope of the claims appended hereto.

What is claimed is:

1. A method of re-programming a utility meter from a first program code to a second program code, while performing metering operations, using an application server program, said utility meter comprising a memory and a microcontroller operating according to program code that is stored in said memory, said method comprising:

controlling, via said microcontroller, the metering operations on said utility meter according to said first program code;

remotely receiving, at said utility meter, said application server program from a remote computer using a public link data connection;

using said application server program to receive the second program code and to control the metering operations on the utility meter while receiving the second program code;

checking an integrity of said second program code to verify the integrity prior to overwriting said first program code, wherein checking the integrity of said second program code comprises utilizing checksums to determine the integrity;

overwriting, in said memory, said first program code with said second program code; and controlling, via said microcontroller, the metering operations according to said second program code.

2. A method in accordance with claim 1, comprising:
checking an integrity of said application server program to verify said integrity prior to using said application server program to control said metering operations on said utility meter.

3. A method in accordance with claim 2, comprising:
aborting use of said application server program in the event that the integrity of said application server program is not verified.

4. A method in accordance with claim 2, wherein:
said checking the integrity of said application server program comprises utilizing checksums to determine the integrity.

5. A method in accordance with claim 1, comprising:
aborting said overwriting of said first program code in the event that the integrity of said second program is not verified.

6. In an automatic meter reading system comprising a host computer, a hub meter, and a client meter, wherein communications between the client meter and the host computer are via the hub meter, a method of re-programming the client meter from a first program code to a second program code, while performing metering operations, said method comprising:

controlling, via a microcontroller, the metering operations on said client meter according to said first program code;

remotely receiving, at said client meter, an application server program, wherein said application server program is received via said hub meter that received the application server program from said host computer using a public link data connection;

using said application server program to receive the second program code and to control the metering operations on the client meter while receiving the second program code;

checking an integrity of said second program code to verify the integrity prior to overwriting said first program code, wherein checking the integrity of said second program code comprises utilizing checksums to determine the integrity;

overwriting said first program code with said second program code; and controlling, via said microcontroller, the metering operations according to said second program code.

7. A method in accordance with claim 6, wherein:
an integrity of said application server program has been checked to verify said integrity prior to using said application server program to control said metering operations on said client meter.

8. A method in accordance with claim 7, comprising:
aborting use of said application server program in the event that the integrity of said application server program is not verified.

9. A method in accordance with claim 7, wherein:
said integrity of said application server program has been checked utilizing checksums to determine the integrity.

10. A method in accordance with claim 6, comprising:
aborting said overwriting of said first program code in the event that the integrity of said second program is not verified.

11. A method in accordance with claim 6, comprising:
receiving, from said host computer, said application server program at said hub meter; and
using said application server program to receive the second program code at the hub meter and to control the metering operations on the client meter while receiving the second program code.

12. A method in accordance with claim 11, comprising:
checking an integrity of said application server program, at said hub meter, to verify said integrity prior to using said application server program to control said metering operations on said hub meter.

13. A method in accordance with claim 12, comprising:
aborting use of said application server program, at said hub meter, in the event that the integrity of said application server program is not verified.

14. A method in accordance with claim 12, wherein:
said checking the integrity of said application server program comprises utilizing checksums to determine the integrity.

15. A method in accordance with claim 11, comprising:
checking an integrity of said second program code, at said hub meter, to verify the integrity prior to overwriting said first program code.

16. A method in accordance with claim 15, comprising:
aborting said receiving of said second program code, at said hub meter, in the event that integrity of said second program is not verified.

17. A method in accordance with claim 15, wherein:
said integrity verification step comprises utilizing checksums to determine the integrity.

18. In an automatic remote metering system comprising a host computer, a hub meter, and a client meter, a method of re-programming the client meter from a first client program code to a second client program code, while performing metering operations, the method comprising:

controlling, via a microcontroller, the metering operations on said client meter according to said first client program code;

remotely receiving, at said client meter, an application server program, wherein said application server program is received via said hub meter that received the application server program from said host computer using a public link data connection;

using said application server program to receive the second client program code and to control the metering operations on the client meter while receiving the second client program code, wherein the second client program code is received via a radio frequency communications link to said hub meter;

checking an integrity of said second client program code to verify the integrity by said hub meter prior to overwriting said first client program code, wherein checking the integrity of said second client program code comprises utilizing checksums to determine the integrity;

overwriting said first client program code with said second client program code; and controlling, via said microcontroller, the metering operations according to said second client program code.

19. A method in accordance with claim 18, comprising:
performing said overwriting step while performing communication functions and said metering operations at said client utility meter.

20. A method in accordance with claim 19, wherein:
said radio frequency link comprises a frequency hopping spread spectrum communications link.

21. A method in accordance with claim 20, wherein:
said communications link comprises a cellular communications link.

22. A method in accordance with claim 18, comprising:
receiving, at said hub meter, a second hub program code from said host computer, wherein said second hub program code is received via a communications link to said host computer;
verifying an integrity of said second hub program code; and
overwriting, in memory at said hub meter, a first hub program code with said second hub program code.

23. A method in accordance with claim 22, comprising:
performing said second hub program code overwriting step while performing communication functions and metering operations at said hub meter.

24. In an automatic remote metering system comprising a host computer, a hub meter, and a client meter, wherein communications between the client meter and the host computer are via the hub meter, a method of re-programming the client meter from a first program code to a second program code, while performing metering operations, the method comprising:
remotely receiving, at the hub meter, an application server program from the host computer via a public link data connection, wherein the public link data connection comprises a cellular communications link to the host computer;
using said application server program to receive the second program code, at said hub meter, and to control the metering operations on the hub meter while receiving the second program code;
verifying an integrity of the second program code prior to sending the second program code to the client meter, wherein verifying the integrity of said second program comprises utilizing checksums to determine the integrity; and
sending, via a radio frequency communications link, the second program code to the client meter for overwriting the first program code on the client meter.

25. A method in accordance with claim 24, wherein prior to using said application server program at said hub meter, an integrity of said application server program is verified by said hub meter; and wherein the method further comprises:
sending said application server program to said client utility meter via said radio frequency communications link.

26. In an automatic remote metering system comprising a host computer, a hub meter, and a client meter, wherein communications between the client meter and the host computer are via the hub meter, a method of re-programming the client meter from a first client program code to a second client program code, while performing metering operations, the method comprising:
remotely receiving at the client meter, via a radio frequency communications link to the hub meter, an application server program, wherein the application server program is received from via said hub meter that received the application server program from said host computer using a public link data connection;
using said application server program to receive the second client program code from said host computer and to send metering information to said host computer while receiving the second client program code, wherein said second client program code is received and said metering information is sent via said radio frequency communications link to said hub meter;
checking an integrity of said second client program code to verify the integrity by said hub meter prior to overwriting said first client program code, wherein checking the integrity of said second client program code comprises utilizing checksums to determine the integrity;
overwriting said first client program code with said second client program code; and
controlling the metering operations according to said second client program code.

27. A method in accordance with claim 26, comprising:
performing said overwriting step while performing communication functions and said metering operations at said client utility meter.

28. A method in accordance with claim 26, wherein:
said radio frequency link comprises a frequency hopping spread spectrum communications link.

29. A method in accordance with claim 28, wherein:
said communications link comprises a cellular communications link.

30. A method in accordance with claim 26, comprising:
receiving, at said hub meter, a second hub program code from said host computer, wherein said second hub program code is received via a communications link;
verifying an integrity of said second hub program code; and
overwriting, in memory at said hub meter, a first hub program code with said second hub program code.

31. A method in accordance with claim 30, comprising:
performing said second hub program code overwriting step while performing communication and metering functions at said hub meter.

* * * * *